United States Patent [19]

Carter et al.

[11] Patent Number: 4,502,915

[45] Date of Patent: Mar. 5, 1985

[54] TWO-STEP PLASMA PROCESS FOR SELECTIVE ANISOTROPIC ETCHING OF POLYCRYSTALLINE SILICON WITHOUT LEAVING RESIDUE

[75] Inventors: Duane E. Carter, Plano; Rhett B. Jucha, Celeste, both of Tex.

[73] Assignee: Texas Instruments Incorporated, Dallas, Tex.

[21] Appl. No.: 572,772

[22] Filed: Jan. 23, 1984

[51] Int. Cl.³ .................... H01L 21/306; B44C 1/22; C03C 15/00; C03C 25/06
[52] U.S. Cl. ................................ 156/643; 156/646; 156/651; 156/657; 156/659.1; 156/662; 204/192 E; 252/79.1
[58] Field of Search ............... 156/643, 646, 651, 657, 156/659.1, 662; 252/79.1; 204/192 E; 427/38, 39

[56] References Cited

U.S. PATENT DOCUMENTS 4,211,601 7/1980 Mogab .......................... 252/79.1 X

FOREIGN PATENT DOCUMENTS 7936 1/1982 Japan .................................. 156/651

Primary Examiner—William A. Powell
Attorney, Agent, or Firm—James T. Comfort; Robert O. Groover; Carlton H. Hoel

[57] ABSTRACT

The disclosure relates to a two-step for selective anisotropic etching of polycrystalline silicon having a silicon dioxide base thereunder and an exposed opposing face with contaminants thereon including silicon dioxide without leaving a residue wherein the silicon is initially etched with a non-selective etchant for a distance below all contaminants and then an etchant used is a highly anisotropic selective polycrystalline silicon etchant.

20 Claims, 1 Drawing Figure

4,502,915

TWO-STEP PLASMA PROCESS FOR SELECTIVE ANISOTROPIC ETCHING OF POLYCRYSTALLINE SILICON WITHOUT LEAVING RESIDUE

BACKGROUND OF THE INVENTION

Field of the Invention

This invention relates to etching of polycrystalline silicon utilizing a plasma etch process.

Description of the Prior Art

Plasma etching of silicon and the production of semiconductor devices as well known and widely used at present. In the past, plasma etching of doped polycrystalline silicon has typically been accomplished by the use of various fluoro, fluorochloro, and fluoro-boro carbon gases such as $CF_4$, $CCl_3F$, $CF_3Br$, and $CCl_2F_2$. Gases of this type have the undesirable property that they etch isotropically and therefore cause lateral etching or undercut in addition to vertical etching. These materials also display a significant etch rate with regard to $SiO_2$. More recently, the use of $Cl_2$ etching at 100 kilohertz excitation frequency has been utilized as well as the use of hydrogen chloride, hydrogen bromide and helium as an etchant. Both of the latter etchants etch anisotropically in that they display negligible lateral etch rates or undercutting and also are highly selective to $SiO_2$. As the device dimensions of semiconductor devices continues to shrink, there is a constantly greater demond on high etch rate ratios between two thin film materials. For example, it is required to etch polycrystalline silicon interconnects and stop on very thin dielectrics such as $SiO_2$. Though highly selective etchants are available, as noted above, they often have the disadvantage of being unable to remove contaminants in the films to be etched. This often causes a residue of unetchable material on a wafer, possibly masking part of the film to be etched. These residues can cause problems in semiconductor manufacturing by blocking ion implants in further steps, causing high contact resistances, making inspections more difficult or by being a source of contamination that can cause delayed failure of the device. It is therefore desirable that these residues be completely removed during the etching process. In order to improve the reproducibility of the semiconductor devices, a selective etch using hydrogen chloride, hydrogen bromide and helium of the type set forth in Ser. No. 566,128 filed De. 27, 1983 was utilized in conjunction with a two-step etch. In the first step, a non-selective etch was utilized for the purpose of removing the very thin residue on the top of the polycrystalline silicon with the subsequent selective etch utilizing the etchant in the above copending application. The initial non-selective etch was for about 10 Angstroms since a layer of $SiO_2$ of about this thickness normally forms on the surface of exposed silicon and the second etch step went the rest of the way in an anisotropic manner. This process still did not provide desirable results and residues were still left at the bottom of the etch. This is apparently due to the fact, as has now been determined, that silicon dioxide forms in the interstices extending to the surface of the polycrystalline silicon and extends below the surface line and between the crystal grains, a distance greater than 10 Angstroms. Also, other impurities may be involved.

SUMMARY OF THE INVENTION

In accordance with the present invention, the above noted problems are overcome by utilizing a two-step etch wherein the first etching step is non-selective in nature and the second step is selective. However, the non-selective etching step is permitted to proceed for a substantial distance beyond 10 Angstroms in order that it can remove all of the impurities extending well below polycrystalline silicon surface. The first step etch is preferably provided using a non-selective etch, such as $CCl_2F_2$ (Freon-12). This etch is carried on for a distance of about 1500 Angstrom units and totally eliminates the residue problem. The second step utilizes the hydrogen chloride, hydrogen bromide, helium etch set forth in the above noted copending application. The $C_2F_6$ etch has a selectivity between doped polycrystalline silicon and $SiO_2$ on the surface of the film of approximately 10:1. Thus, while etching the polycrystalline silicon, this etch easily removes small amounts of $SiO_2$ that are incorporated into the grain boundaries of the film. Other chloro-fluoro carbon based plasmas can also be used in place of the Freon-12 and perform the same function. The fluorocarbon etch is utilized with some chlorine for passivation or with some bromine for better passivation and selectivity if selectivity is desired. It follows therefore that, in accordance with the present invention, a highly effective two-step etch is provided wherein the first step is non-selective and substantially isotropic and utilizes preferably a carbon-fluorine etch or a carbon-fluorine-chlorine etch, the etch taking place for a rather substantial distance in the vicinity of about 1500 Angstrom units. The second step of the etch utilizes a very anisotropic etchant such as the above mentioned hydrogen chloride, hydrogen bromide, helium etch solution.

BRIEF DESCRIPTION OF THE DRAWING

The FIGURE is an enlarged view of a portion of a polycrystalline silicon wafer over a silicon dioxide base and showing the typical composition of the exposed surface of the polycrystalline silicon material.

DESCRIPTION OF THE PREFERRED EMBODIMENT

Figure 1:
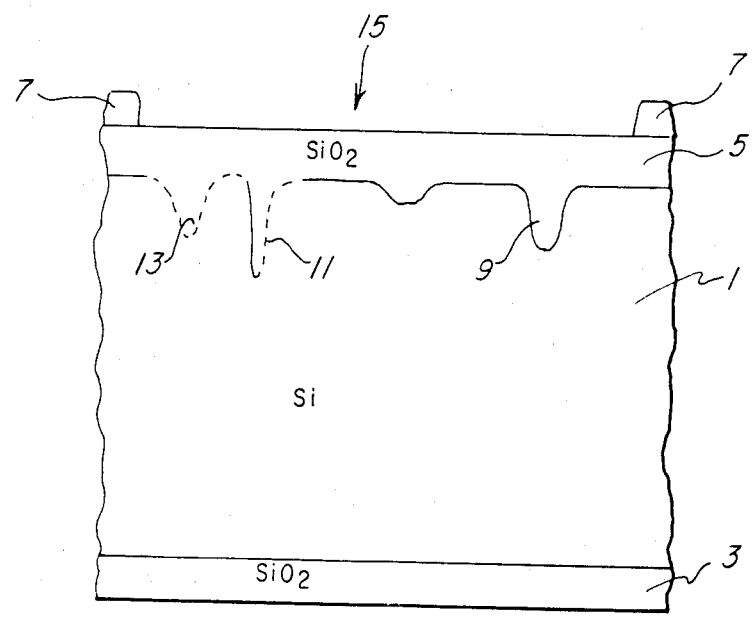

Referring first to the figure, there is shown a layer of polycrystalline silicon 1 which has preferably been doped with an appropriate dopant such as phosphorous and which rests over a silicon dioxide base 3. The base 3 has a thickness typically on the order of 200 Angstrom units. Shown at the upper surface of the silicon material is a layer of silicon dioxide 5 with possibly contaminants therein which is on the order of about 10 Angstrom units. Such layers are normally in the range of 10 to 20 Angstrom units and, as stated above, can include impurities other than silicon dioxide as well. Shown above the silicon dioxide layer 5 is a portion of a mask 7 through which plasma etching will take place in standard manner. It can be seen that the silicon dioxide layer 5, which is normally formed at exposed surfaces of the polycrystalline silicon layer 1 due to oxidation with the air and the like, is not planar in its contact with the polycrystalline silicon layer. in fact, since there are spaces between the polycrystalline silicon grains extending to the surface of layer 1, the silicon dioxide 5 will tend to form below the surface of the layer 1 in the regions noted as 9, 11 and 13 since these regions will be exposed to oxidants such as the air.

As stated above, it is desired to etch in the region 15 shown by the arrow between the mask sections 7 so that all of the layer 5 and polycrystalline silicon 1 can be removed therebelow with vertical sidewalls down to the silicon dioxide layer 3 without etching of the layer 3. The etching is provided in a two-step process wherein, in step one, an etch having the following formula is used:

STEP I.
Freon 12—100 sccm
Helium—75 sccm
Power—250 watts
Pressure—0.7 torr.
Temp.—4° C.
Plt. Sp.—¼"
Electrode
Material—Anodized Al
Frequency—13.56 MHz and in the step two of the etch, the following etchant is used:

STEP II
HCl—160 sccm
HBr—35 sccm
He—100 sccm
Power—250 watts
Pressure—1.3 torr.
Plt. Sp.—¼"
Electrode
Material—Anodized Al
Frequency—13.56 MHz As stated above, plasma etching techniques are utilized herein using the above noted etchants. In step one, the step one etch is utilized to provide an isotropic etch to a distance below the oxide portion 11 so that all of the impurity has been removed in addition to the silicon dioxide layer 5 and a portion of the polycrystalline silicon layer 1. This etch step will cease at the earliest point possible so that the second step of etching can take place for the longest distance possible in an anisotropic manner. A first step etch of about 1500 Angstrom units has been found to provide satisfactory results. The second step etch is highly selective to silicon dioxide and therefore will etch with vertical walls directly down to the silicon dioxide layer 3 whereupon the etching will cease. As stated above, substantially any fluoro or chloro-fluoro carbon based plasma etch can be used as the step one etchant. These etchants are well known in the prior art. In the case of the step two etch, any standard chlorine-containing and/or bromine-containing etchant can be used alone or in combination. The use of increased bromine will provide additional selectivity if such selectivity is desired.

It can be seen that the use of a chloro-fluoro carbon based etch such as Freon-12 for the initial step of a multiple step etching process, where the final etching step is highly anisotropic and selective to polycrystalline silicon, with sufficient etch time provided for the Freon-12 portion of the etch, will eliminate non-etchable residues that are readily observable when only a chlorine or chlorine and bromine based etch is used or wherein a chloro-fluoro carbon based etchant is used for an insufficient etching distance.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of etching polycrystalline silicon disposed over an insulating base and having contaminants extending to the surface of the silicon face opposite said base, comprising the steps of:
   (a) etching said face with a substantially non-selective etchant, and
   (b) etching said face with an etchant selective to polycrystalline silicon.

2. The method of claim 1 wherein said non-selective etchant is taken from the class consisting of chloro-fluorocarbon, fluoro-boro carbon and fluorocarbon based etchants and wherein said selective etchant is taken from the class consisting of chlorine-containing etchants, bromine-containing etchants, chloride-containing etchants, bromide-containing etchants and combinations thereof.

3. The method of claim 1 wherein said non-selective etch extends to a depth of about 1500 Angstrom units from said face.

4. The method of claim 2 wherein said non-selective etch extends to a depth of about 1500 Angstrom units from said face.

5. The method of claim 1 wherein said non-selective etchant is a fluorocarbon containing etchant and said selective etchant is composed of HCl, HBr and He.

6. The method of claim 2 wherein said non-selective etchant is a fluorocarbon containing etchant and said selective etchant is composed of HCl, HBr and He.

7. The method of claim 3 wherein said non-selective etchant is a fluorocarbon containing etchant and said selective etchant is composed of HCl, HBr, and He.

8. The method of claim 4 wherein said non-selective etchant is a flurocarbon containing etchant and said selective etchant is composed of HCl, HBr and He.

9. The method of claim 5 wherein the ratio of HCl to HBr by volume is about 5:1.

10. The method of claim 6 wherein the ratio of HCl to HBr by volume is about 5:1.

11. The method of claim 7 wherein the ratio of HCl to HBr by volume is about 5:1.

12. The method of claim 8 wherein the ratio of HCl to HBr by volume is about 5:1.

13. The method of claim 5 wherein the non-selective etchant comprises $CCl_2F_2$.

14. The method of claim 6 wherein the non-selective etchant comprises $CCl_2F_2$.

15. The method of claim 7 wherein the non-selective etchant comprises $CCl_2F_2$.

16. The method of claim 8 wherein the non-selective etchant comprises $CCl_2F_2$.

17. The method of claim 9 wherein the non-selective etchant comprises $CCl_2F_2$.

18. The method of claim 10 wherein the non-selective etchant comprises $CCl_2F_2$.

19. The method of claim 11 wherein the non-selective etchant comprises $CCl_2F_2$.

20. The method of claim 12 wherein the non-selective etchant comprises $CCl_2F_2$.

* * * * *

US004502915B1

REEXAMINATION CERTIFICATE (3656th)

United States Patent [19]
Carter et al.

[11] B1 4,502,915
[45] Certificate Issued Nov. 3, 1998

[54] TWO-STEP PLASMA PROCESS FOR SELECTIVE ANISOTROPIC ETCHING OF POLYCRYSTALLINE SILICON WITHOUT LEAVING RESIDUE

[75] Inventors: Duane E. Carter, Plano; Rhett B. Jucha, Celeste, both of Tex.

[73] Assignee: Texas Instruments Incorporated, Dallas, Tex.

Reexamination Request:
No. 90/004,629, Apr. 30, 1997

Reexamination Certificate for:
Patent No.: 4,502,915
Issued: Mar. 5, 1985
Appl. No.: 572,772
Filed: Jan. 23, 1984

[51] Int. Cl.[6] .......................... H01L 21/306; B44C 1/22; C03C 15/00; C03C 25/06
[52] U.S. Cl. .......................... 438/734; 252/79.1; 438/738
[58] Field of Search .......................... 438/710, 719, 438/735, 721, 733, 734, 724, 744; 252/79.1; 216/67, 79

[56] References Cited

FOREIGN PATENT DOCUMENTS 55-11167  7/1978  Japan .

*Primary Examiner*—William A. Powell

[57] ABSTRACT

The disclosure relates to a two-step for selective anisotropic etching of polycrystalline silicon having a silicon dioxide base thereunder and an exposed opposing face with contaminants thereon including silicon dioxide without leaving a residue wherein the silicon is initially etched with a non-selective etchant for a distance below all contaminants and then an etchant used is a highly anisotropic selective polycrystalline silicon etchant.

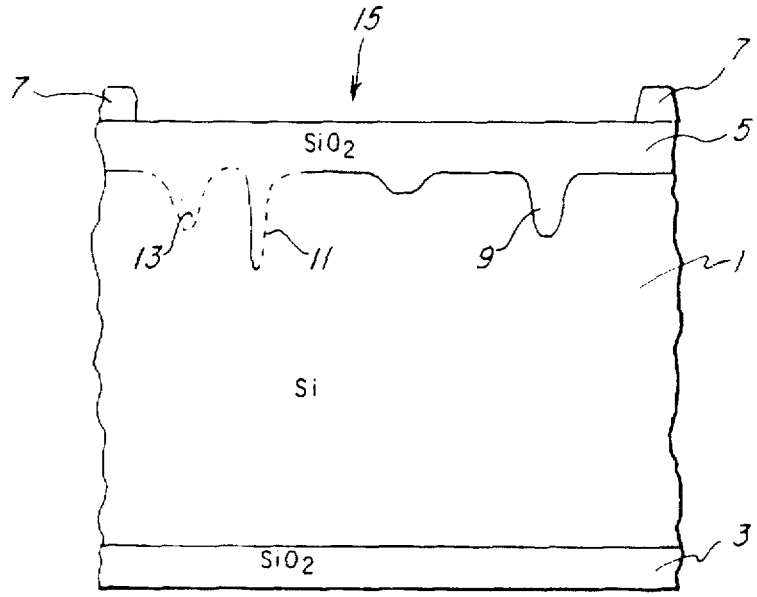

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2 and 3–20, dependent on an amended claim, are determined to be patentable.

New claims 21 and 22–25 are added and determined to be patentable.

1. A method of etching polycrystalline silicon disposed over an insulating base and having contaminants extending to the surface of the silicon face opposite said base, comprising the steps of:
   (a) etching said face with a substantially non-selective etchant, *wherein said non-selective etchant reacts with atoms from said silicon face;* and
   (b) etching said face with an etchant selective to polycrystalline silicon.

*21. A method of etching polycrystalline silicon disposed over an insulating base and having contaminants extending to the surface of the silicon face opposite said base, comprising the steps of:*

*etching at least 10 Angstroms of said polycrystalline silicon from said face with a substantially non-selective etchant, wherein said non-selective etchant reacts with atoms from said silicon face;*

*etching said polycrystalline silicon with an etchant selective to polycrystalline silicon.*

*22. The method of claim 21 wherein said non-selective etchant is taken from the class consisting of chlorofluorocarbon, fluoro-boro carbon and fluorocarbon based etchants and wherein said selective etchant is taken from the class consisting of chlorine-containing etchants, bromine-containing etchants, chloride-containing etchants, bromide-containing etchants and combinations thereof.*

*23. The method of claim 1 wherein said non-selective etchant is a fluorocarbon containing etchant and said selective etchant is composed of HCl, HBr and He.*

*24. The method of claim 23 wherein the ration of HCl to HBr by volume is about 5:1.*

*25. The method of claim 23 wherein the non-selective etchant comprises $CCl_2F_2$.*

* * * * *